(12) United States Patent
Kobayashi

(10) Patent No.: US 7,994,867 B2
(45) Date of Patent: Aug. 9, 2011

(54) OSCILLATOR CONTROL APPARATUS

(75) Inventor: Hiroyuki Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 12/555,178

(22) Filed: Sep. 8, 2009

(65) Prior Publication Data

US 2010/0214028 A1    Aug. 26, 2010

(30) Foreign Application Priority Data

Feb. 24, 2009    (JP) .................. 2009-040668

(51) Int. Cl.
*H03L 7/00* (2006.01)

(52) U.S. Cl. .......... 331/1 A; 331/16; 331/34; 327/156; 327/159; 375/376

(58) Field of Classification Search .......... 331/1 A, 331/16; 327/156, 159; 375/376
See application file for complete search history.

(56) References Cited

U.S. PATENT DOCUMENTS 7,791,428 B2 * 9/2010 Chang et al. .................. 332/123

FOREIGN PATENT DOCUMENTS

JP    2009-21954    1/2009

OTHER PUBLICATIONS

Robert Bogdan Staszewski, et al., "All-Digital TX Frequency Synthesizer and Discrete-Time Receiver for Bluetooth Radio in 130-nm CMOS", IEEE Journal of Solid-State Circuits, vol. 39, No. 12, Dec. 2004, pp. 2278-2291.

* cited by examiner

*Primary Examiner* — Arnold Kinkead
(74) *Attorney, Agent, or Firm* — Oblon, Spivak, McClelland, Maier & Neustadt, L.L.P.

(57) ABSTRACT

An oscillator control apparatus has a digitally-controlled oscillator which outputs an oscillation signal having an oscillation frequency in response to an oscillator adjusting signal, a counter which counts the oscillation signal and outputs a count in response to a reference signal in synchronism with the oscillation signal, a time-to-digital converter which calculates a phase difference between the oscillation signal and the reference signal, an adder which adds the count and the phase difference and outputs the added value as first phase information, a corrector which corrects the first phase information in response to a phase control signal for setting an oscillation frequency of the digitally-controlled oscillator when a time difference between a rising-up timing of the oscillation signal and a rising-up timing of the reference signal is less than a predetermined time, and outputs second phase information, and a filter for smoothing a difference between the phase control signal and the second phase information, to output the oscillator adjusting signal.

11 Claims, 5 Drawing Sheets if     dCKV-d<A & |Acc1-(CNTV+d)| > |Acc1-(CNTV-1+d)| : Acc2=CNTV-1+d
else if d    <A & |Acc1-(CNTV+d)| > |Acc1-(CNTV+1+d)| : Acc2=CNTV+1+d
else                                                  : Acc2=CNTV+d

FIG. 6 if |Acc1-(CNTV+d)| > B:Acc2=Acc1
else
    if     dCKV-d<A & |Acc1-(CNTV+d)| > |Acc1-(CNTV-1+d)| : Acc2=CNTV-1+d
    else if d    <A & |Acc1-(CNTV+d)| > |Acc1-(CNTV+1+d)| : Acc2=CNTV+1+d
    else                                                  : Acc2=CNTV+d

OSCILLATOR CONTROL APPARATUS

CROSS REFERENCE TO RELATED APPLICATION

This application is based upon and claims benefit of priority from the Japanese Patent Application No. 2009-40668, filed on Feb. 24, 2009, the entire contents of which are incorporated herein by reference.

BACKGROUND OF THE INVENTION

The present invention relates to an oscillator control apparatus.

An All Digital Phase Locked Loop (ADPLL) circuit, in which all of control signals in a phase locked loop (PLL) are digitized, has been recently used in a radio communication apparatus such as radio LAN equipment (see, for example, Japanese Patent Application Laid-open No. 2009-21954). In the ADPLL circuit, an analog circuit is replaced with a digital circuit, and therefore, the advance of processes can save a space and electric power.

The ADPLL circuit includes a digital loop filter, a digitally-controlled oscillator (DCO), a counter, and a time-to-digital converter (TDC). The counter is adapted to count outputs from the DCO and to output a count in response to a reference signal synchronized with the output from the DCO. The TDC takes a phase difference of 1 cycle or less of the output from the DCO in synchronism with the reference signal. A comparison result (i.e., a difference) between a value obtained by adding the count and the phase difference and a phase control signal is applied to the digital loop filter. An oscillation frequency of the DCO is controlled based on the output from the digital loop filter.

The output from the DCO is asynchronous to the reference signal. In other words, in the ADPLL circuit, outputs from the two circuits (i.e., the counter and the TDC) operative by an asynchronous clock are added. As a consequence, a value read by the counter is shifted, thereby raising a possibility of instable operation of the PLL.

SUMMARY OF THE INVENTION

According to one aspect of the present invention, there is provided an oscillator control apparatus comprising:

a digitally-controlled oscillator which outputs an oscillation signal having an oscillation frequency in response to an oscillator adjusting signal;

a counter which counts the oscillation signal and outputs a count in response to a reference signal in synchronism with the oscillation signal;

a time-to-digital converter which calculates a phase difference between the oscillation signal and the reference signal;

an adder which adds the count and the phase difference and outputs the added value as first phase information;

a corrector which corrects the first phase information in response to a phase control signal for setting an oscillation frequency of the digitally-controlled oscillator when a time difference between a rising-up timing of the oscillation signal and a rising-up timing of the reference signal is less than a predetermined time, and outputs second phase information; and a filter for smoothing a difference between the phase control signal and the second phase information, to output the oscillator adjusting signal.

BRIEF DESCRIPTION OF THE DRAWINGS

FIG. 6 is a diagram illustrating an example of a description of operation of the corrector according to the embodiment;

FIG. 7 is a diagram illustrating an example of a description of operation of a corrector according to a modification.

DESCRIPTION OF THE EMBODIMENTS

A description will be given below according to an embodiment of the present invention with reference to the attached drawings.

Figure 1:
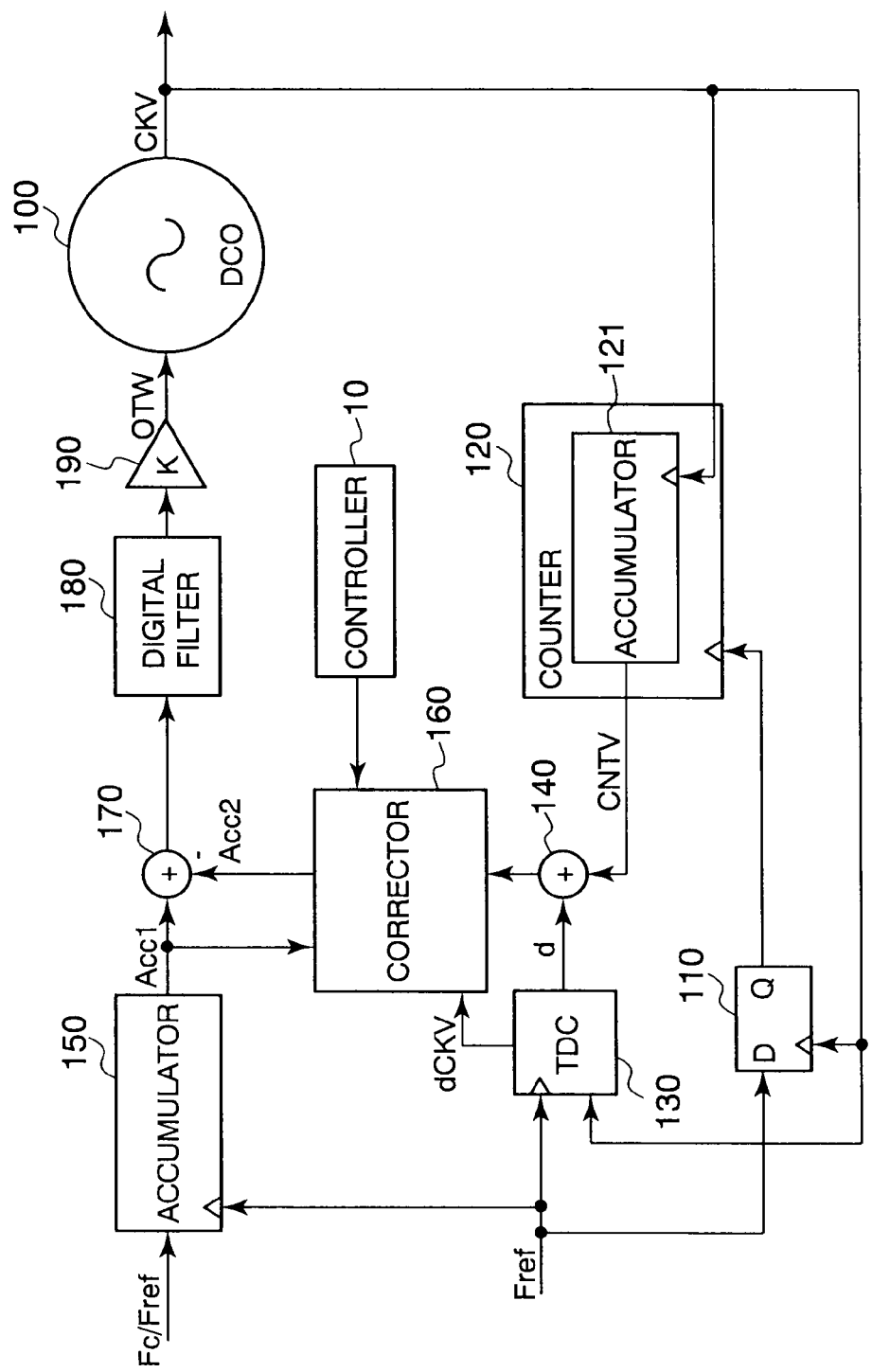
FIG. 1 is a diagram schematically illustrating the configuration of an oscillator control apparatus according to an embodiment of the present invention.

FIG. 1 is a diagram schematically illustrating the configuration of an oscillator control apparatus according to an embodiment of the present invention. The oscillator control apparatus is provided with a digitally-controlled oscillator (hereinafter abbreviated as a DCO) 100, a flip-flop 110, a counter 120, a Time-to-Digital Converter (TDC) 130, an adder 140, an accumulator 150, a corrector 160, a subtractor 170, a digital filter 180, and a multiplier 190, thus constituting an ADPLL (All Digital Phase Locked Loop).

The DCO 100 is an oscillator whose oscillation frequency can be discretely controlled in response to an outside control signal (Oscillator Tuning Word (OTW)). The DCO 100 is achieved by controlling a plurality of varactor capacities in binary.

The flip-flop 110 holds a value of a reference signal Fref and outputs the signal in response to an output signal (i.e., an oscillation signal) CKV from the DCO 100 as a clock input. In other words, the flip-flop 110 outputs the reference signal Fref synchronized with the output signal CKV from the DCO 100.

The counter 120 includes an accumulator 121 which receives the output signal CKV from the DCO 100 as a clock. The counter 120 receives the output signal from the flip-flop 110 as a clock, and then, outputs a value from the accumulator 121 as a count CNTV in synchronism with the clock. In other words, the counter 120 is a circuit to be operated in synchronism with the output signal CKV from the DCO 100.

When, for example, the frequency of the output signal CKV from the DCO 100 is 2400 MHz and the frequency of the reference signal Fref is 40 MHz, the count CNTV output from the counter 120 is a value incremented by 60.

The TDC 130 is a time measuring device capable of digitally representing a phase difference d between the output signal CKV from the DCO 100 and the reference signal Fref with an accuracy minuter than 1 cycle of the output signal CKV from the DCO 100. The TDC 130 is a circuit to be operated in synchronism with the reference signal Fref. In other word, the TDC 130 is operated by a clock asynchronous to the counter 120.

Figure 2:
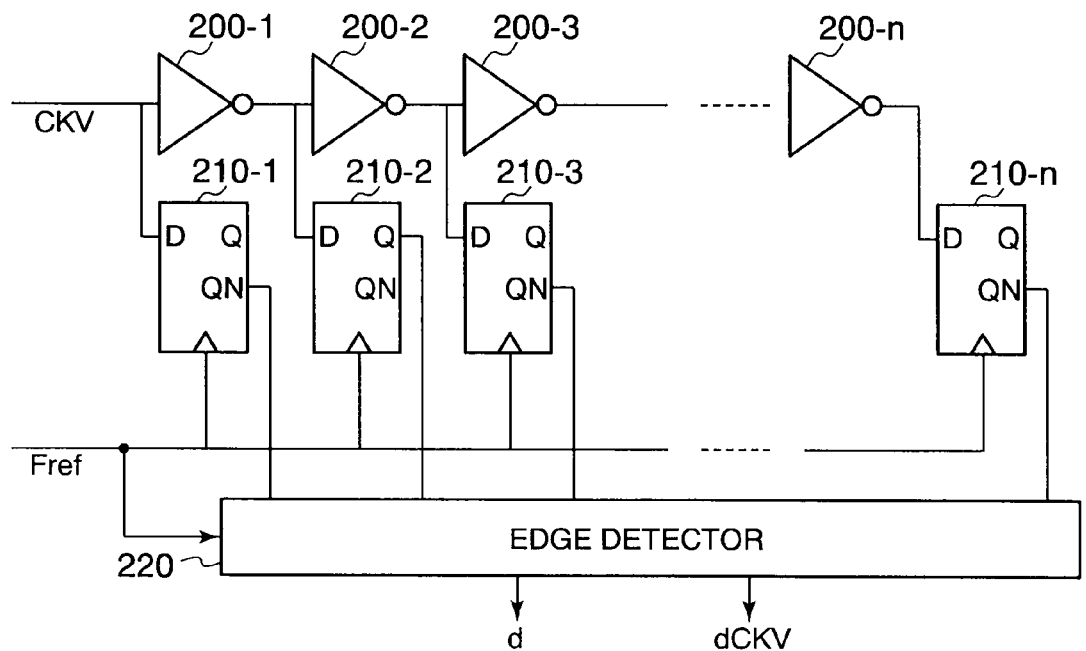
FIG. 2 is a diagram schematically illustrating the configuration of a TDC according to the embodiment.

FIG. 2 exemplifies the configuration of the TDC 130. The TDC 130 includes reverse circuits (i.e., inverters) 200-1 to 200-$n$ ($n$ is an integer of 2 or more), flip-flops 210-1 to 210-$n$, and an edge detector 220. The reverse circuits 200-1 to 200-$n$ are connected in series to each other, for sequentially outputting the output signal CKV from the DCO 100 with a delay. A delay time in each of the reverse circuits 200-1 to 200-$n$ is, for example, several tens ps.

The flip-flops 210-1 to 210-$n$ hold output signals from the reverse circuits 200-1 to 200-$n$ according to a rising-up or rising-down edge of the reference signal Fref, respectively, and then, output them.

The edge detector 220 detects the phase difference d between the output signal CKV from the DCO 100 and the reference signal Fref (with an accuracy minuter than 1 cycle of the signal CKV) out of the outputs from the flip-flops 210-1 to 210-$n$ at a transition timing of the reference signal Fref, and then, outputs it to the adder 140 as a digital value. Moreover, the edge detector outputs a length dCKV of 1 cycle of the output signal CKV from the DCO 100 to the corrector 160.

The adder 140 adds the count CNTV output from the counter 120 and the phase difference d output from the TDC 130, and then, outputs the added value (i.e., first phase information) to the corrector 160.

The accumulator 150 integrates a value obtained by standardizing a frequency control signal Fc with the reference signal Fref, and then, outputs the integrated value to the corrector 160 and the subtractor 170 as a phase control signal Acc1.

The corrector 160 corrects the first phase information CNTV+d of the oscillation signal CKV from the DCO 100 based on the phase control signal Acc1, the output signal from the adder 140 (i.e., the first phase information CNTV+d), and the cycle dCKV of the output signal CKV from the DCO 100, and then, outputs second phase information Acc2 to the subtractor 170.

The corrector 160 corrects the phase information in a normal state, that is, in a state in which the oscillation frequency in the DCO 100 is stable. A controller 10 controls whether or not the corrector 160 corrects the phase information. The controller 10 allows the corrector 160 to correct the first phase information after a lapse of a predetermined time (e.g., about 200 μs by Bluetooth®) after the oscillator control apparatus starts to be operated. Until the lapse of a predetermined time, the corrector 160 does not correct the first phase information CNTV+d but outputs it to the subtractor 170.

Hereinafter, description will be given on a method for correcting the phase information by the corrector 160. The corrector 160 determines whether or not a difference (dCKV-d) between the cycle dCKV of the output signal CKV from the DCO 100 and the phase difference d between the output signal CKV from the DCO 100 and the reference signal Fref (with the accuracy minuter than 1 cycle of the signal CKV) is smaller than a predetermined value A.

Figure 3:
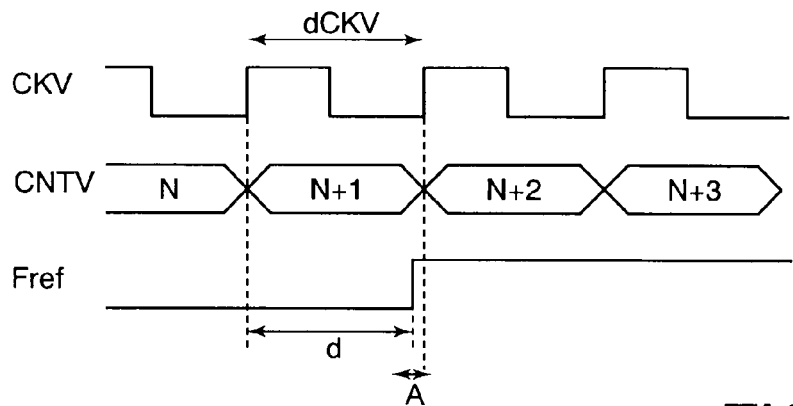
FIG. 3 is an example of a timing chart illustrating each of the signals in the oscillator control apparatus according to the embodiment.

The difference dCKV-d being smaller than the predetermined value A signifies that the reference signal Fref rises up near the rising-up of the oscillation signal CKV, as illustrated in FIG. 3. In this case, the reference signal Fref rises up somewhat earlier than the oscillation signal CKV. An arbitrary value may be set as the predetermined value A from the outside. For example, when the delay time of each of the reverse circuits 200-1 to 200-$n$ in the TDC 130 is 1/10 of the cycle dCKV and the TDC 130 can detect the phase difference with an accuracy of 1/10 of 1 cycle of the oscillation signal CKV, A=0.2.

When the difference dCKV-d is smaller than the predetermined value A, the corrector 160 determines whether or not a difference |Acc1−(CNTV+d)| between the phase control signal Acc1 and the phase information CNTV+d is greater than |Acc1−(CNTV−1+d)|. This is to determine whether or not the output CNTV from the counter 120 is shifted since the counter 120 and the TDC 130 are operated by the asynchronous clock.

For example, in FIG. 3, the phase difference d output from the TDC 130 should be added to a value N output from the counter 120 (i.e., the accumulator 121). However, when the reference signal Fref rises up near the rising-up of the oscillation signal CKV, the output CNTV from the counter 120 is shifted, thereby raising a possibility that the phase difference d and the value N+1 are added.

In view of the above, when |Acc1−(CNTV+d)| is greater than |Acc1−(CNTV−1+d)|, it is determined that the output CNTV from the counter 120 is shifted. When |Acc1−(CNTV+d)| is greater than |Acc1−(CNTV−1+d)|, the corrector 160 subtracts 1 from the phase information CNTV+d output from the adder 140, and then, outputs it to the subtractor 170 as the corrected phase information Acc2.

In contrast, the corrector 160 outputs the phase information CNTV+d as it is to the subtractor 170 as the phase information Acc2 when |Acc1−(CNTV+d)| is |Acc1−(CNTV−1+d)| or smaller.

Figure 4:
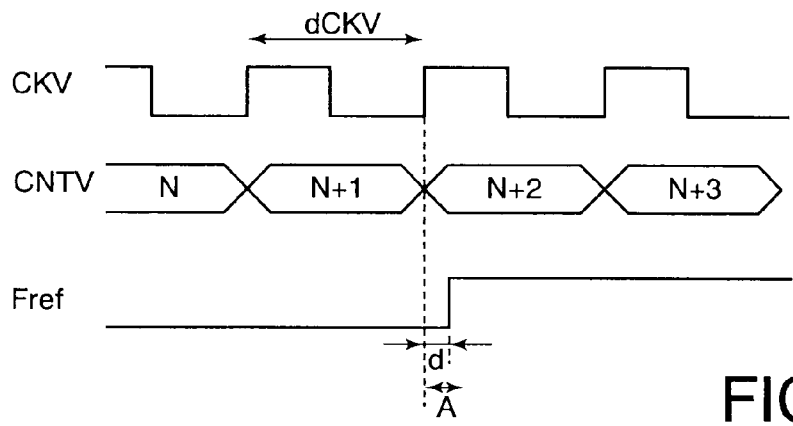
FIG. 4 is an example of a timing chart illustrating each of the signals in the oscillator control apparatus according to the embodiment.

In addition, the corrector 160 determines whether or not the phase difference d is smaller than the predetermined value A. The phase difference d being smaller than the predetermined value A signifies that the reference signal Fref rises up near the rising-up of the oscillation signal CKV, as illustrated in FIG. 4. In this case, the reference signal Fref rises up somewhat later than the oscillation signal CKV.

When the phase difference d is smaller than the predetermined value A, the corrector 160 determines whether or not the difference |Acc1−(CNTV+d)| between the phase control signal Acc1 and the phase information CNTV+d is greater than |Acc1−(CNTV+1+d)|. This is to determine whether or not the output CNTV from the counter 120 is shifted since the counter 120 and the TDC 130 are operated by the asynchronous clock.

For example, in FIG. 4, the phase difference d output from the TDC 130 should be added to a value N+1 output from the counter 120 (i.e., the accumulator 121). However, when the reference signal Fref rises up near the rising-up of the oscillation signal CKV, the output CNTV from the counter 120 is shifted, thereby raising a possibility that the phase difference d and the value N are added.

In view of the above, when |Acc1−(CNTV+d)| is greater than |Acc1−(CNTV+1+d)|, it is determined that the output CNTV from the counter 120 is shifted. When |Acc1−(CNTV+d)| is greater than |Acc1−(CNTV+1+d)|, the corrector 160 adds 1 to the phase information CNTV+d output from the adder 140, and then, outputs it to the subtractor 170 as the corrected the phase information Acc2.

In contrast, the corrector 160 outputs the phase information CNTV+d as it is to the subtractor 170 as the phase information Acc2 when |Acc1−(CNTV+d)| is |Acc1−(CNTV+1+d)| or smaller.

In other cases, that is, when the difference dCKV-d is the predetermined A or greater and the phase difference d is the predetermined A or greater, the corrector 160 outputs the phase information CNTV+d as it is to the subtractor 170 as the phase information Acc2.

Figure 5:
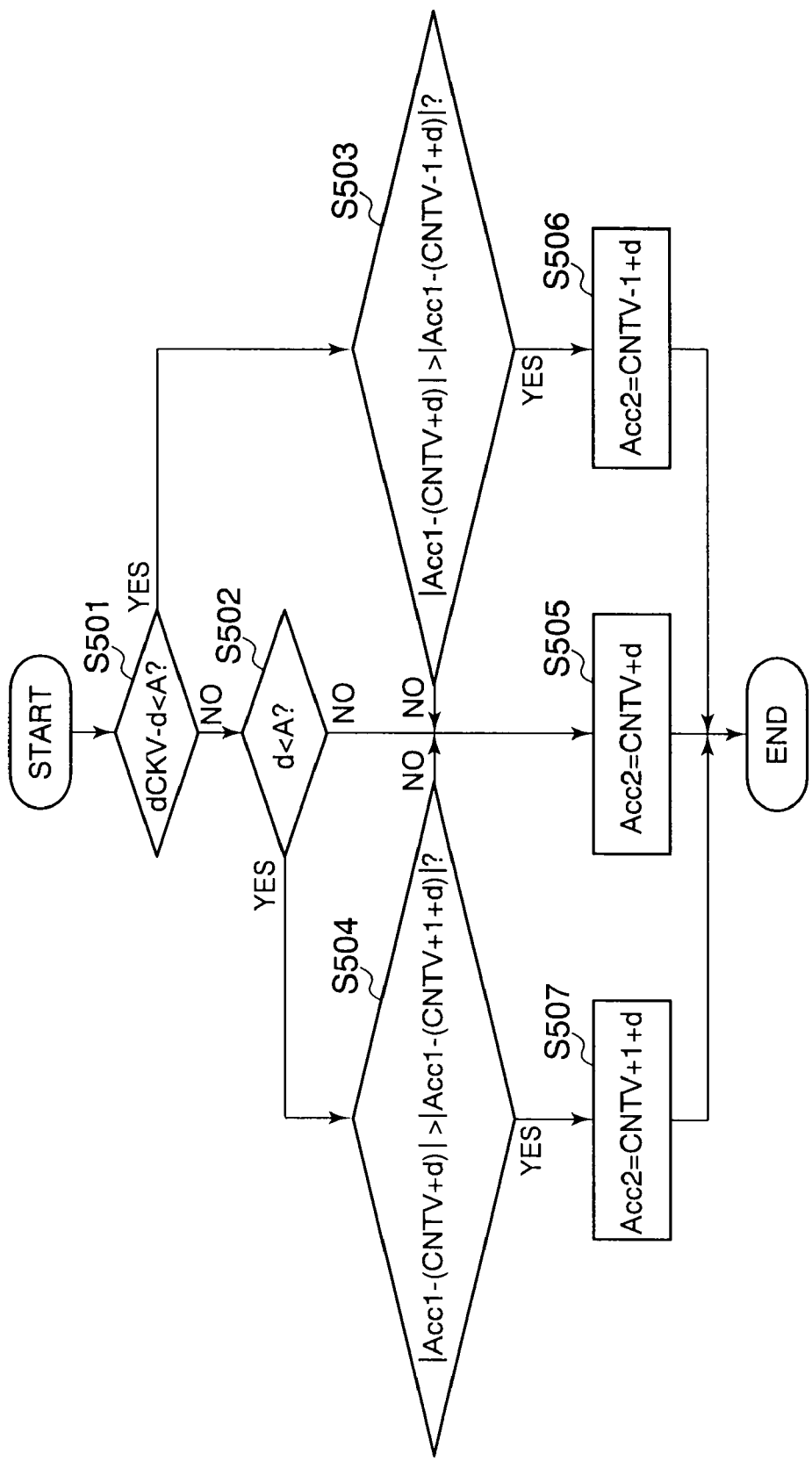
FIG. 5 is a flowchart illustrating a method for correcting phase information in a corrector according to the embodiment.

The above-described operation of the corrector 160 will be described below with reference to a flowchart illustrated in FIG. 5.

(Step S501)

It is determined whether or not the difference between the cycle dCKV and the phase difference d is smaller than the predetermined value A. If the difference is smaller than the predetermined value A, the control routine proceeds to step S503. In contrast, if the difference is the predetermined value A or greater, the control routine proceeds to step S502.

(Step S502)

It is determined whether or not the phase difference d is smaller than the predetermined value A. If the phase difference d is smaller than the predetermined value A, the control routine proceeds to step S504. In contrast, if the phase difference d is the predetermined value A or greater, the control routine proceeds to step S505.

(Step S503)

It is determined whether or not the difference |Acc1−(CNTV+d)| between the phase control signal Acc1 and the phase information CNTV+d is greater than |Acc1−(CNTV−1+d)|. If |Acc1−(CNTV+d)| is greater than |Acc1−(CNTV−1+d)|, the control routine proceeds to step S506.

In contrast, if |Acc1−(CNTV+d)| is |Acc1−(CNTV−1+d)| or smaller, the control routine proceeds to step S505.

(Step S504)

It is determined whether or not the difference |Acc1−(CNTV+d)| between the phase control signal Acc1 and the phase information CNTV+d is greater than |Acc1−(CNTV+1+d)|.

If |Acc1−(CNTV+d)| is greater than |Acc1−(CNTV+1+d)|, the control routine proceeds to step S507. In contrast, if |Acc1−(CNTV+d)| is |Acc1−(CNTV+1+d)| or smaller, the control routine proceeds to step S505.

(Step S505)

The phase information CNTV+d output from the adder 140 is output as it is to the subtractor 170 as the phase information Acc2.

(Step S506)

The value obtained by subtracting 1 from the phase information CNTV+d output from the adder 140 is output to the subtractor 170 as the phase information Acc2.

(Step S507)

The value obtained by adding 1 to the phase information CNTV+d output from the adder 140 is output to the subtractor 170 as the phase information Acc2.

Otherwise, the operation of the corrector 160 may be described as illustrated in FIG. 6.

As illustrated in FIG. 1, the subtractor 170 calculates a difference between the phase control signal Acc1 and the phase information Acc2 output from the corrector 160, and then, outputs the difference to the digital filter 180.

The digital filter 180 acts as a low-pass filter, to smooth the received difference.

The multiplier 190 multiplies the output from the digital filter 180 by a coefficient K, and then, outputs the signal OTW. A frequency gain with respect to a control value in the DCO 100 is corrected by multiplying the coefficient K.

When the oscillation frequency in the DCO 100 becomes greater (or smaller) than a value set by the frequency control signal Fc, the digital filter 180 and the multiplier 190 output the signal OTW to control to decrease (or increase) the oscillation frequency based on the difference calculated in the subtractor 170. In this manner, the oscillation frequency in the DCO 100 is controlled to become constant.

Even if the count CNTV added to the phase difference d is shifted by the asynchronous operation of the counter 120 and the TDC 130, the corrector 160 can correct the shift, thereby preventing any erroneous operation so as to enhance the stability of the PLL operation.

In this manner, the oscillator control apparatus according to the present embodiment can achieve the stable PLL operation.

In the above-described embodiment, when the transition (i.e., rising-up) time of the output from the flip-flop 110 becomes long, the count output from the counter 120 may be markedly shifted. In this case, the corrector 160 outputs the phase control signal Acc1 as the phase information Acc2. In other words, the output CNTV+d from the adder 140 is not considered. As a consequence, the PLL operation can be prevented from becoming instable. Incidentally, the operation of the corrector 160 in this case may be described as illustrated in FIG. 7. A threshold B is, for example, 2.

Figure 8:
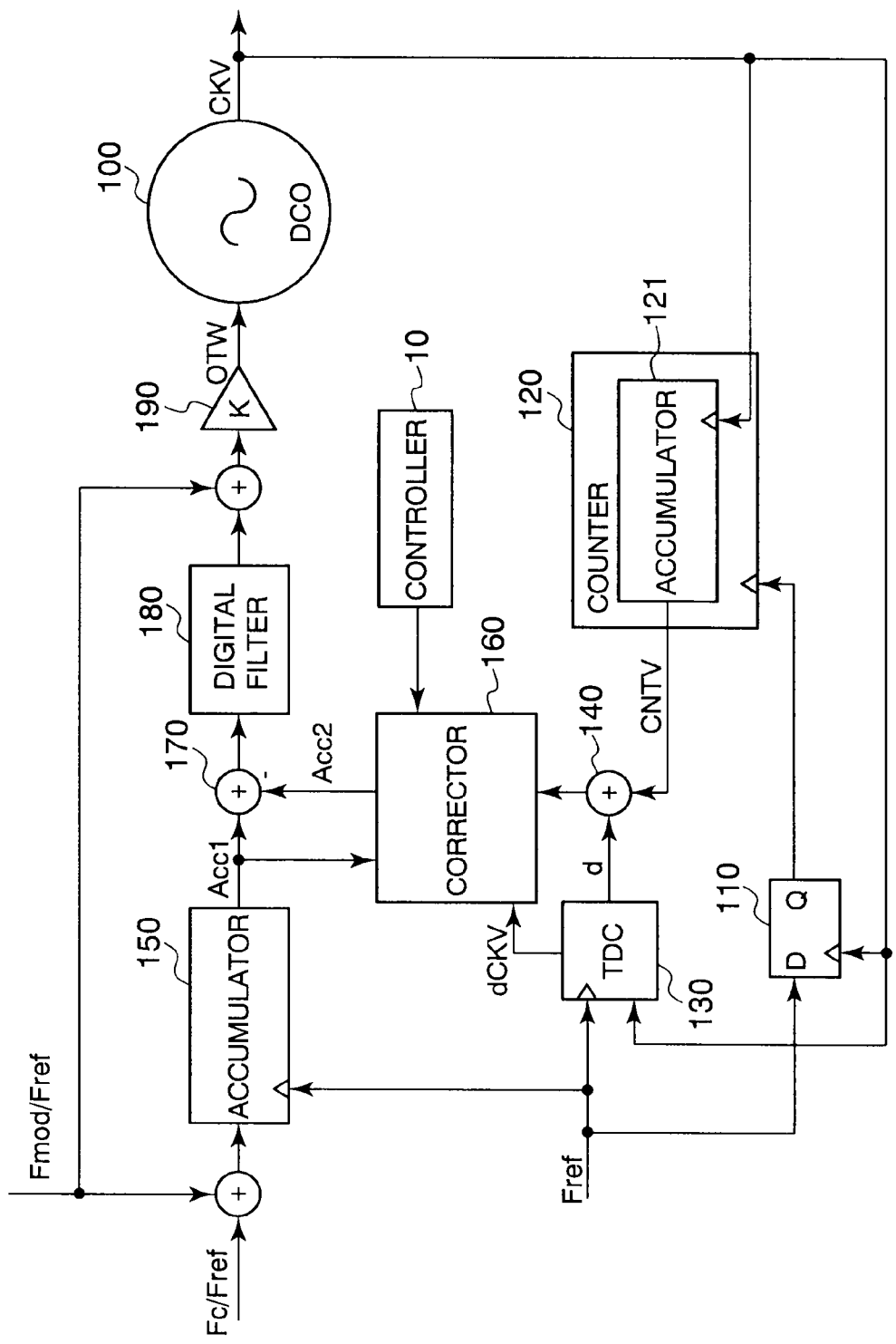
FIG. 8 is a diagram schematically illustrating the configuration of an oscillator control apparatus according to the modification.

Alternatively, as illustrated in FIG. 8, an input to the accumulator 150 and an output from the digital filter 180 may be multiplied by a value obtained by standardizing modulation data Fmod by the reference signal Fref. With this configuration, modulation can be controlled with high accuracy in modulating a wide bandwidth.

The oscillator control apparatus in the embodiment may be applied to the ADPLL having a frequency as low as about 100 kHz as the frequency of the reference signal Fref, the ADPLL taking much time to restore once an erroneous operation occurs.

Or, the oscillator control apparatus in the embodiment may be applied to radio LAN equipment, a mobile telephone, a broadcast wave receiver, or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oscillator control apparatus comprising:
a digitally-controlled oscillator which outputs an oscillation signal having an oscillation frequency in response to an oscillator adjusting signal;
a counter which counts the oscillation signal and outputs a count in response to a reference signal in synchronism with the oscillation signal;
a time-to-digital converter which calculates a phase difference between the oscillation signal and the reference signal;
an adder which adds the count and the phase difference and outputs the added value as first phase information;
a corrector which corrects the first phase information in response to a phase control signal for setting an oscillation frequency of the digitally-controlled oscillator when a time difference between a rising-up timing of the oscillation signal and a rising-up timing of the reference signal is less than a predetermined time, and outputs second phase information; and
a filter for smoothing a difference between the phase control signal and the second phase information, to output the oscillator adjusting signal.

2. The oscillator control apparatus according to claim 1, wherein the corrector does not correct the first phase information but outputs the first phase information as the second phase information from the beginning of operation until a lapse of a second predetermined time.

3. The oscillator control apparatus according to claim 1, further comprising an accumulator which integrates a frequency control signal multiplied by modulation data by using the reference signal as a clock, to output the phase control signal, the modulation data being multiplied by the filter output.

4. The oscillator control apparatus according to claim 3, wherein the corrector does not correct the first phase information but outputs the first phase information as the second phase information from the beginning of operation until a lapse of a second predetermined time.

5. The oscillator control apparatus according to claim 1,
wherein the corrector outputs a value obtained by subtracting 1 from the first phase information as the second phase information when a value obtained by subtracting the phase difference from 1 cycle time of the oscillation signal is more than the predetermined time and a first difference as a difference between the phase control signal and the first phase information is greater than a second difference as a difference between the phase control signal and the value obtained by subtracting 1 from the first phase information, whereas outputs the first phase information as the second phase information when the first difference is the second difference or less;

outputs a value obtained by adding 1 to the first phase information as the second phase information when the phase difference is the predetermined time or less and the first difference is more than a third difference as the difference between the phase control signal and the value obtained by adding 1 to the first phase information, whereas outputs the first phase information as the second phase information when the first difference is the third difference or less; and outputs the first phase information as the second phase information when a value obtained by subtracting the phase difference from 1 cycle time of the oscillation signal is more than the predetermined time and the phase difference is the predetermined time or more.

6. The oscillator control apparatus according to claim 5, wherein the corrector does not correct the first phase information but outputs the first phase information as the second phase information from the beginning of operation until a lapse of a second predetermined time.

7. The oscillator control apparatus according to claim 5, further comprising an accumulator which integrates a frequency control signal multiplied by modulation data by using the reference signal as a clock, to output the phase control signal, the modulation data being multiplied by the filter output.

8. The oscillator control apparatus according to claim 5, wherein the corrector outputs the same value as the phase control signal as the second phase information when the first difference is greater than a predetermined value.

9. The oscillator control apparatus according to claim 8, wherein the corrector does not correct the first phase information but outputs the first phase information as the second phase information from the beginning of operation until a lapse of a second predetermined time.

10. The oscillator control apparatus according to claim 8, further comprising an accumulator which integrates a frequency control signal multiplied by modulation data by using the reference signal as a clock, to output the phase control signal, the modulation data being multiplied by the filter output.

11. The oscillator control apparatus according to claim 10, wherein the corrector does not correct the first phase information but outputs the first phase information as the second phase information from the beginning of operation until a lapse of a second predetermined time.

* * * * *